United States Patent
Dunton et al.

(10) Patent No.: US 10,121,913 B2
(45) Date of Patent: Nov. 6, 2018

(54) SOLAR PHOTOVOLTAIC MODULE SAFETY SHUTDOWN SYSTEM

(71) Applicant: Helios Focus LLC, Scottsdale, AZ (US)

(72) Inventors: Randy R. Dunton, Phoenix, AZ (US); Geoffrey Sutton, Scottsdale, AZ (US)

(73) Assignee: Helios Focus LLC, Scottsdale, AZ (US)

( * ) Notice: Subject to any disclaimer, the term of this patent is extended or adjusted under 35 U.S.C. 154(b) by 656 days.

(21) Appl. No.: 14/532,883

(22) Filed: Nov. 4, 2014

(65) Prior Publication Data

US 2015/0061409 A1 Mar. 5, 2015

Related U.S. Application Data

(60) Continuation-in-part of application No. 14/511,042, filed on Oct. 9, 2014, now Pat. No. 9,369,126, which
(Continued)

(51) Int. Cl.
*H02J 3/38* (2006.01)
*H01L 31/02* (2006.01)
(Continued)

(52) U.S. Cl.
CPC ........ *H01L 31/02021* (2013.01); *H02J 3/383* (2013.01); *H03K 17/687* (2013.01);
(Continued)

(58) Field of Classification Search
CPC .. H02J 3/383; H02J 1/06; H02S 40/34; H02S 40/30; Y02E 10/50; H02H 7/20;
(Continued)

(56) References Cited

U.S. PATENT DOCUMENTS 5,693,952 A 12/1997 Cox
6,046,514 A * 4/2000 Rouillard ................ H01M 2/34
200/210
(Continued)

FOREIGN PATENT DOCUMENTS

EP 1039361 9/2000
WO WO2009051870 4/2009
(Continued)

OTHER PUBLICATIONS

Li et al., A Current Fed Two-Inductor Boost Converter for Grid Interactive Photovoltaic Applications, Austalasian Universities Power Engineering Conference, Brisbane Australia, pp. 1-6 (2004).
(Continued)

*Primary Examiner* — Ryan Johnson
(74) *Attorney, Agent, or Firm* — IPTechLaw

(57) ABSTRACT

A solar photovoltaic module safety shutdown system includes a module-on switch coupled with a first circuit having a photovoltaic module and a System-Monitor device. The System-Monitor device couples to the module-on switch through a second circuit and to the photovoltaic module and an AC main panelboard through the first circuit. A module-off switch operatively couples with the photovoltaic module and the module-on switch. The System-Monitor device supplies a System-on signal to the module-on switch through the second circuit. The module-on switch disables the photovoltaic module by shorting it or disconnecting it from the first circuit in response to the System-On signal not being received by the module-on switch from the System-Monitor device. The module-off switch disables the photovoltaic module by shorting it in response to the System-On signal not being received by the module-on switch when the photovoltaic module is irradiated with light.

20 Claims, 16 Drawing Sheets

Related U.S. Application Data is a division of application No. 12/813,036, filed on Jun. 10, 2010, now Pat. No. 8,859,884.

(60) Provisional application No. 61/252,985, filed on Oct. 19, 2009.

(51) Int. Cl.
  *H02S 40/34* (2014.01)
  *H03K 17/795* (2006.01)
  *H03K 17/687* (2006.01)

(52) U.S. Cl.
  CPC .......... *H03K 17/7955* (2013.01); *H02S 40/34* (2014.12); *Y02E 10/50* (2013.01); *Y10T 307/76* (2015.04)

(58) Field of Classification Search
  CPC .... H02H 11/00; H02H 7/268; Y10T 307/685; Y10T 307/76; Y10T 307/729; H03K 17/78; H03K 17/687; H03K 17/7955; H01L 31/02021
  See application file for complete search history.

(56) References Cited

U.S. PATENT DOCUMENTS

| | | | |
|---|---|---|---|
| 7,161,082 B2 | 1/2007 | Matsushita et al. | |
| 7,807,919 B2 | 10/2010 | Powell et al. | |
| 8,204,709 B2 | 6/2012 | Presher, Jr. et al. | |
| 8,207,637 B2 * | 6/2012 | Marroquin | H01L 31/02021 307/147 |
| 8,963,375 B2 * | 2/2015 | DeGraaff | H01L 31/02021 307/128 |
| 9,000,615 B2 * | 4/2015 | Robbins | H01L 31/02021 307/116 |
| 9,525,286 B2 * | 12/2016 | Kohler | H01L 31/02021 |
| 2002/0014262 A1 | 2/2002 | Matsushita et al. | |
| 2006/0162772 A1 | 7/2006 | Presher, Jr. et al. | |
| 2006/0231132 A1 | 10/2006 | Neussner | |
| 2006/0267515 A1 | 11/2006 | Burke et al. | |
| 2007/0012352 A1 * | 1/2007 | Wohlgemuth | B32B 17/10018 136/251 |
| 2007/0186969 A1 | 8/2007 | Kohler et al. | |
| 2008/0097655 A1 | 4/2008 | Hadar | |
| 2008/0257397 A1 | 10/2008 | Glaser et al. | |
| 2009/0020151 A1 | 1/2009 | Fornage | |
| 2009/0141522 A1 | 6/2009 | Adest et al. | |
| 2009/0182532 A1 | 7/2009 | Stoeber et al. | |
| 2010/0043868 A1 | 2/2010 | Sun et al. | |
| 2010/0071742 A1 | 3/2010 | de Rooij et al. | |
| 2010/0071744 A1 | 3/2010 | Peurach et al. | |
| 2010/0071747 A1 | 3/2010 | Brescia et al. | |
| 2010/0139734 A1 * | 6/2010 | Hadar | H01L 31/02021 136/244 |
| 2010/0154858 A1 | 6/2010 | Jain | |
| 2010/0269889 A1 | 10/2010 | Reinhold et al. | |
| 2012/0139343 A1 | 6/2012 | Adest et al. | |
| 2016/0036235 A1 * | 2/2016 | Getsla | H02J 3/383 307/80 |

FOREIGN PATENT DOCUMENTS

| | | |
|---|---|---|
| WO | WO2010065043 | 6/2010 |
| WO | WO2010078303 | 7/2010 |

OTHER PUBLICATIONS

Endecon Engineering, A Guide to Photovoltaic (PV) System Design and Installation, Consultant Report to California Energy Commission, pp. 1-39 (2001).
TUV, solar panel micro inverter 260W/grid tie micro inverter, catalogue page, (http://sunconpv.en.alibaba.com/product/663777786-213426577/solar_panel_micro_inverter_260W_grid_tie_micro_inverter.html), download Sep. 20, 2013.
Build It Solar, (http://builditsolar.com/Projects/Vehicles/E15ElecTrak/PVCharge.htm), download Sep. 20, 2013.
Enphase Microinverter M190, Microinverter Technical Data, pp. 1-2, Enphase Energy, Inc., Petaluma, California, available as early as Jun. 9, 2010.
Enphase Microinverter Models M190 and M210 Installation and Operations Manual, 2010, Rev. 8, pp. 1-28, Enphase Enerby, Inc., Petaluma, California.
Quick Install Guide, Enphase Energy, Inc., Petaluma, California, available as early as Jun. 9, 2010.
Field Wiring Diagram, Enphase Energy, Inc., Petaluma, California, available as early as Jun. 9, 2010.
PCT Search Report, dated Jun. 21, 2011, Application No. PCT/US2010/053164.
International Preliminary Report, dated Apr. 24, 2012, Application No. PCT/US2010/053164.
Written Opinion of International Search Authority, dated Apr. 19, 2012.

* cited by examiner

SOLAR PHOTOVOLTAIC MODULE SAFETY SHUTDOWN SYSTEM

CROSS REFERENCE TO RELATED APPLICATIONS

This application is a continuation-in-part application of the earlier filed U.S. Utility patent application Ser. No. 14/511,042, filed Oct. 9, 2014, titled "Solar Photovoltaic Module Safety Shutdown System," naming as first inventor Randy R. Dunton, now pending, which is a divisional application of the earlier U.S. Utility patent application Ser. No. 12/813,036, filed Jun. 10, 2010, titled "Solar Photovoltaic Module Safety Shutdown System," naming as first inventor Randy R. Dunton, issued as U.S. Pat. No. 8,859,884 on Oct. 14, 2014, which claims the benefit of the filing date of U.S. Provisional Patent Application Ser. No. 61/252,985, filed Oct. 19, 2009, titled "Solar photovoltaic module safety shutdown system," naming as first inventor Randy R. Dunton, the disclosures of each of which are all hereby incorporated entirely herein by reference.

BACKGROUND

1. Technical Field

Aspects of this document relate generally to photovoltaic systems.

2. Background Art

FIG. 1 describes a typical photovoltaic (PV) grid-tied 100 or off-grid 110 system. A PV system consists of a number of modules 101; each module by itself generates power when exposed to light. A series of modules is wired together to create a higher voltage string 102. Multiple PV strings may be wired in parallel to form a PV array 103. The PV array connects to a DC-disconnect switch 104, and the DC disconnect switch feeds power to a grid-tied inverter 105 which converts the DC power from the array to AC power for the grid.

Off-grid systems 110 connect the PV array 103 to the DC disconnect, and on to a battery charger 111, which stores the electrical energy in batteries 112. Off-grid residential systems typically use an off-grid inverter 113 that produces AC electricity for AC loads connected to an AC main panelboard 106.

Inside a silicon cell based module 200, shown in FIG. 2, there is a series of photovoltaic cells 201, the basic building block in solar electric systems. Each cell is producing approximately 0.5 volts and a few amps (e.g. 5 A). The PV cells are also wired in series and in parallel within the module to achieve a desired voltage and current, and each module has a positive and negative module terminal 202 to connect to the PV system. A typical module used in a residential or commercial power generating system will produce in the order of 18-50V DC at 90-200 W at its electrical connectors. There are two terminals one positive and the other negative. Arrays used in residential installations will typically produce power in the range of 2 kW-10 kW with voltages up to 600V DC (grid-tied). The module voltage and power output is true for other module architectures such as thin-film (CdTe, CIGS, etc.)

When a PV array is installed and operational, the PV system generates power whenever there is light present. Furthermore, it is impractical to disable the system beyond shutting off the AC mains or the DC disconnect. Once wired, the array itself is never able to fully shut down in the presence of light even with the DC disconnect in the open position. The string wiring connecting all the modules in series, the wiring to the DC disconnect, and the array will all continue to generate lethal levels of voltage when exposed to light.

In the case of a damaged array from fire or natural disaster, an open (non-insulated) wire of the array's circuits may present itself. The exposed circuits provide a higher likelihood of an unintended electrical circuit path to ground (ground fault), and a human can become a part of this path to ground either by touching or through exposure to water. With a human body in a ground fault circuit it is very likely to be lethal. The National Fire Protection Association (NFPA) 70E defines "low voltage" somewhere near ~50V. This low voltage is the threshold where one is able to generally survive a shock and "let go" (~9 mA). PV systems are well above this level. This poses a serious and very real problem for firefighters when they encounter a building on fire with a PV array.

Even an operational and properly insulated system poses a potential problem for service technicians in the case of a PV array in need of service. In the case of the need to replace a defective module the person may be exposed to high voltages even with the DC disconnect in the "off" or "open" position.

In the case of earthquakes, floods, or other natural disasters, partially destroyed PV systems pose a threat to the occupants of a structure and any rescue personnel, especially untrained civilians.

SUMMARY

Implementations of a solar photovoltaic module safety shutdown switch may include: a module-on switch configured to operatively couple with a first circuit having a photovoltaic module and to operatively couple with a System-Monitor device, the System-Monitor device configured to operatively couple to the module-on switch through a second circuit and configured to operatively couple to the photovoltaic module and an alternating current (AC) main panelboard through the first circuit; and a module-off switch coupled with the module-on switch; wherein the System-Monitor device is configured to generate a System-On signal and to supply the System-On signal to the module-on switch through the second circuit; wherein the module-on switch is configured to disable the photovoltaic module through one of shorting the photovoltaic module and disconnecting the photovoltaic module from the first circuit in response to the System-On signal not being received by the module-on switch from the System-Monitor device; and wherein the module-off switch is configured to disable the photovoltaic module through shorting the photovoltaic module in response to the System-On signal not being received by the module-on switch when the photovoltaic module is irradiated with light.

Implementations of a solar photovoltaic module safety shutdown switch may include one, all, or any of the following:

The solar photovoltaic module safety shutdown switch may further include module-off logic configured to operatively couple to the photovoltaic module and configured to operatively couple to the module-off switch, the module-off logic configured to drive the module-off switch to an on state in response to a first positive voltage being present between a gate of a transistor of the module-on switch and a negative terminal of a first cell of the photovoltaic module when a second positive voltage is present between a positive terminal of a last cell of the photovoltaic module and the negative terminal of the first cell of the photovoltaic module.

The solar photovoltaic module safety shutdown switch may further include module-off logic configured to operatively couple to the photovoltaic module and configured to operatively couple to the module-off switch, the module-off logic configured to drive the module-off switch to an off state in response to no voltage being present between a gate of a transistor of the module-on switch and a negative terminal of a first cell of the photovoltaic module when a positive voltage is present between a positive terminal of a last cell of the photovoltaic module and the negative terminal of the first cell of the photovoltaic module.

The module-on switch and module-off switch may be integrally formed in a back sheet of the photovoltaic module.

The solar photovoltaic module safety shutdown switch may further include module-off logic configured to operatively couple to the photovoltaic module and configured to operatively couple to the module-off switch, the module-off logic configured to drive the module-off switch between an on state and an off state, wherein the module-off logic includes an opto-isolator configured to produce a voltage across terminals of a transistor of the module-off switch in response to a first positive voltage being present between a gate of a transistor of the module-on switch and a negative terminal of a first cell of the photovoltaic module when a second positive voltage is present between a positive terminal of a last cell of the photovoltaic module and the negative terminal of the first cell of the photovoltaic module.

The module-on switch may include an opto-isolated field effect transistor (FET) photovoltaic driver configured to provide a gate voltage to a power metal-oxide semiconductor field effect transistor (MOSFET) in response to the System-On signal being received by the module-on switch from the System-Monitor device.

The module-on switch may not include a rectifier, and the opto-isolated FET photovoltaic driver may be configured to provide the gate voltage only during half of an AC cycle.

A gate of the power MOSFET may be configured to store a sufficient charge to remain at a high enough voltage to allow the power MOSFET to remain on during an entire AC cycle.

The System-Monitor device may include a manual switch and may be configured to generate the System-On signal and to supply the System-On signal to the module-on switch only when the manual switch is in an on position.

The module-on switch may include an opto-isolator configured to communicatively couple the first circuit with the second circuit while electrically isolating the first circuit from the second circuit.

Implementations of a solar photovoltaic module safety shutdown system may include: a photovoltaic module having a module-on switch operatively coupled thereto, the module-on switch and photovoltaic module configured to operatively couple with a first circuit, the module-on switch configured to operatively couple with a System-Monitor device, the System-Monitor device configured to operatively couple to the module-on switch through a second circuit and configured to operatively couple to the photovoltaic module and an alternating current (AC) main panelboard through the first circuit; and a module-off switch operatively coupled with the photovoltaic module and the module-on switch; wherein the System-Monitor device is configured to generate a System-On signal and to supply the System-On signal to the module-on switch through the second circuit; wherein the module-on switch is configured to disable the photovoltaic module through one of shorting the photovoltaic module and disconnecting the photovoltaic module from the first circuit in response to the System-On signal not being received by the module-on switch from the System-Monitor device; and wherein the module-off switch is configured to disable the photovoltaic module through shorting the photovoltaic module in response to the System-on signal not being received by the module-on switch when the photovoltaic module is irradiated with light.

Implementations of a solar photovoltaic module safety shutdown system may include one, all, or any of the following:

The solar photovoltaic module safety shutdown system may include module-off logic configured to drive the module-off switch to an on state in response to a first positive voltage being present between a gate of a transistor of the module-on switch and a negative terminal of a first cell of the photovoltaic module when a second positive voltage is present between a positive terminal of a last cell of the photovoltaic module and the negative terminal of the first cell of the photovoltaic module.

The solar photovoltaic module safety shutdown system may further include module-off logic configured to drive the module-off switch to an off state in response to no voltage being present between a gate of a transistor of the module-on switch and a negative terminal of a first cell of the photovoltaic module when a positive voltage is present between a positive terminal of a last cell of the photovoltaic module and the negative terminal of the first cell of the photovoltaic module.

The module-on switch and module-off switch may be integrally formed within a back sheet of the photovoltaic module.

The solar photovoltaic module safety shutdown system may further include module-off logic configured to drive the module-off switch between an on state and an off state, and the module-off logic may include an opto-isolator configured to produce a voltage across terminals of a transistor of the module-off switch in response to a first positive voltage being present between a gate of a transistor of the module-on switch and a negative terminal of a first cell of the photovoltaic module when a second positive voltage is present between a positive terminal of a last cell of the photovoltaic module and the negative terminal of the first cell of the photovoltaic module.

Implementations of a solar photovoltaic module safety shutdown system may include: a first photovoltaic module having a first module-on switch and a first module-off switch, the first photovoltaic module operatively coupled with a first circuit, the first circuit operatively coupled to an alternating current (AC) main panelboard; a second photovoltaic module having a second module-on switch and a second module-off switch, the second photovoltaic module operatively coupled with the first photovoltaic module through the first circuit; a second circuit operatively coupled with the first module-on switch and with the second module-on switch; a System-Monitor device operatively coupled with the first circuit, the second circuit, and the AC main panelboard, the System-Monitor device including a manual switch, the System-Monitor device configured to generate a System-On signal and to supply the System-On signal to the first module-on switch and to the second module-on switch through the second circuit when the manual switch is in an on state; wherein the first module-on switch is configured to disable the first photovoltaic module through one of shorting the first photovoltaic module and disconnecting the first photovoltaic module from the first circuit when the System-On signal is not received by the first module-on switch from the second circuit; wherein the first module-off switch is configured to disable the first photovoltaic module through shorting the first photovoltaic module in response to the System-On signal not being received by the first module-on switch when the first photovoltaic module is irradiated with light; wherein the second module-on switch is configured to disable the second photovoltaic module through one of shorting the first photovoltaic module and disconnecting the first photovoltaic module from the first circuit when the System-On signal is not received by the second module-on switch from the second circuit; and wherein the second module-off switch is configured to disable the second photovoltaic module through shorting the second photovoltaic module in response to the System-On signal not being received by the second module-on switch when the second photovoltaic module is irradiated with light.

Implementations of a solar photovoltaic module safety shutdown system may include one, all, or any of the following:

The first photovoltaic module may include module-off logic configured to drive the first module-off switch to an on state in response to a first positive voltage being present between a gate of a transistor of the first module-on switch and a negative terminal of a first cell of the first photovoltaic module when a second positive voltage is present between a positive terminal of a last cell of the first photovoltaic module and the negative terminal of the first cell of the first photovoltaic module.

The first module-on switch and first module-off switch may be integrally formed in a back sheet of the first photovoltaic module and the second module-on switch and second module-off switch may be integrally formed in a back sheet of the second photovoltaic module.

The first photovoltaic module may include module-off logic configured to drive the first module-off switch to an off state in response to no voltage being present between a gate of a transistor of the first module-on switch and a negative terminal of a first cell of the first photovoltaic module when a positive voltage is present between a positive terminal of a last cell of the first photovoltaic module and the negative terminal of the first cell of the first photovoltaic module.

The first photovoltaic module may include module-off logic configured to drive the first module-off switch between an on state and an off state, and the module-off logic may include an opto-isolator configured to produce a voltage across terminals of a transistor of the first module-off switch in response to a first positive voltage being present between a gate of a transistor of the first module-on switch and a negative terminal of a first cell of the first photovoltaic module when a second positive voltage is present between a positive terminal of a last cell of the first photovoltaic module and the negative terminal of the first cell of the first photovoltaic module.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended solar photovoltaic module safety shutdown systems and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such solar photovoltaic module safety shutdown systems and related methods, and implementing components and methods, consistent with the intended operation and methods.

Typically a firefighter disables power to a dwelling at the main AC panelboard of a home prior to dousing it with water. Shutting off power to the AC main panelboard automatically disables every individual module in a photovoltaic (PV) array in one embodiment. In natural disasters the AC mains of a building will likely be off, again making the PV system safe in one embodiment. Additional systems allow for automatic shutdown in the case of natural disasters.

Figure 1:
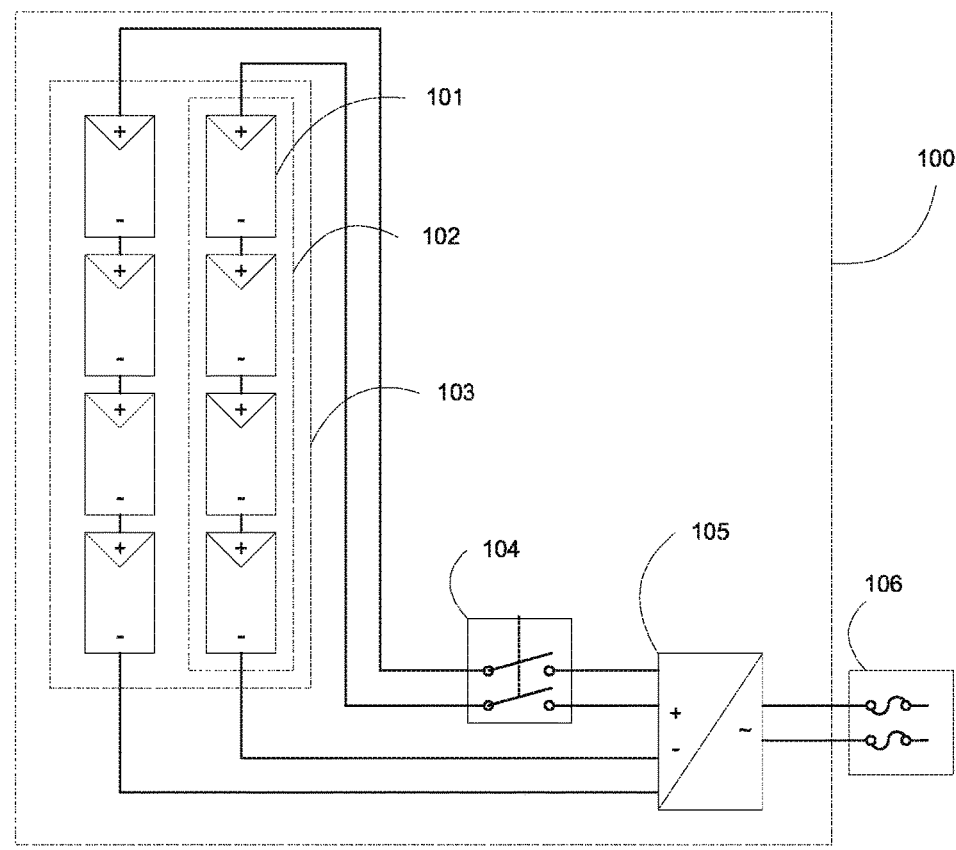
FIG. 1 illustrates two embodiments of a solar photovoltaic (PV) system with all the major system components.
Figure 1:
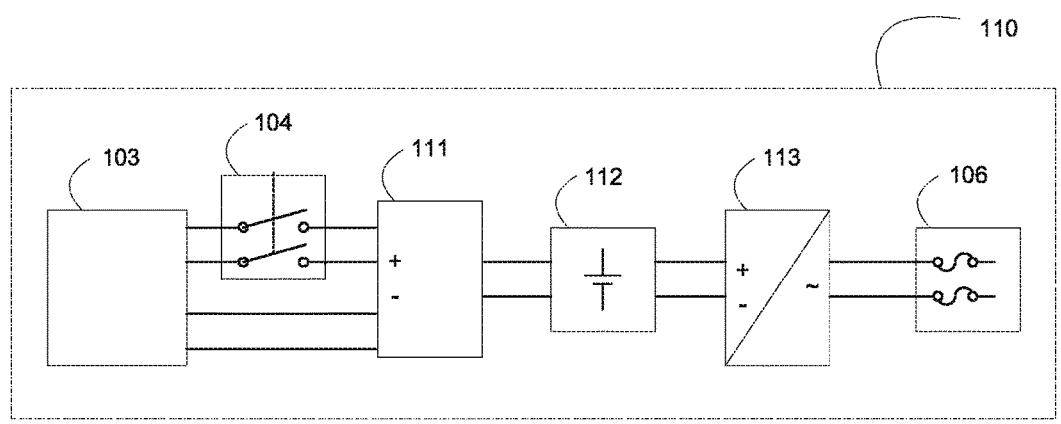
Figure 2:
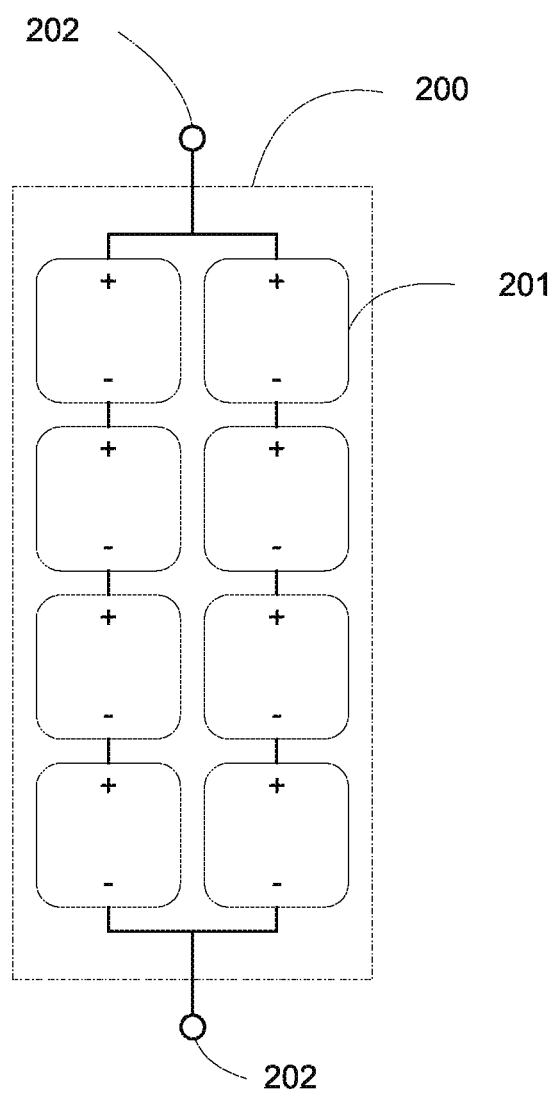
FIG. 2 illustrates the elements of a current PV module.
Figure 3:
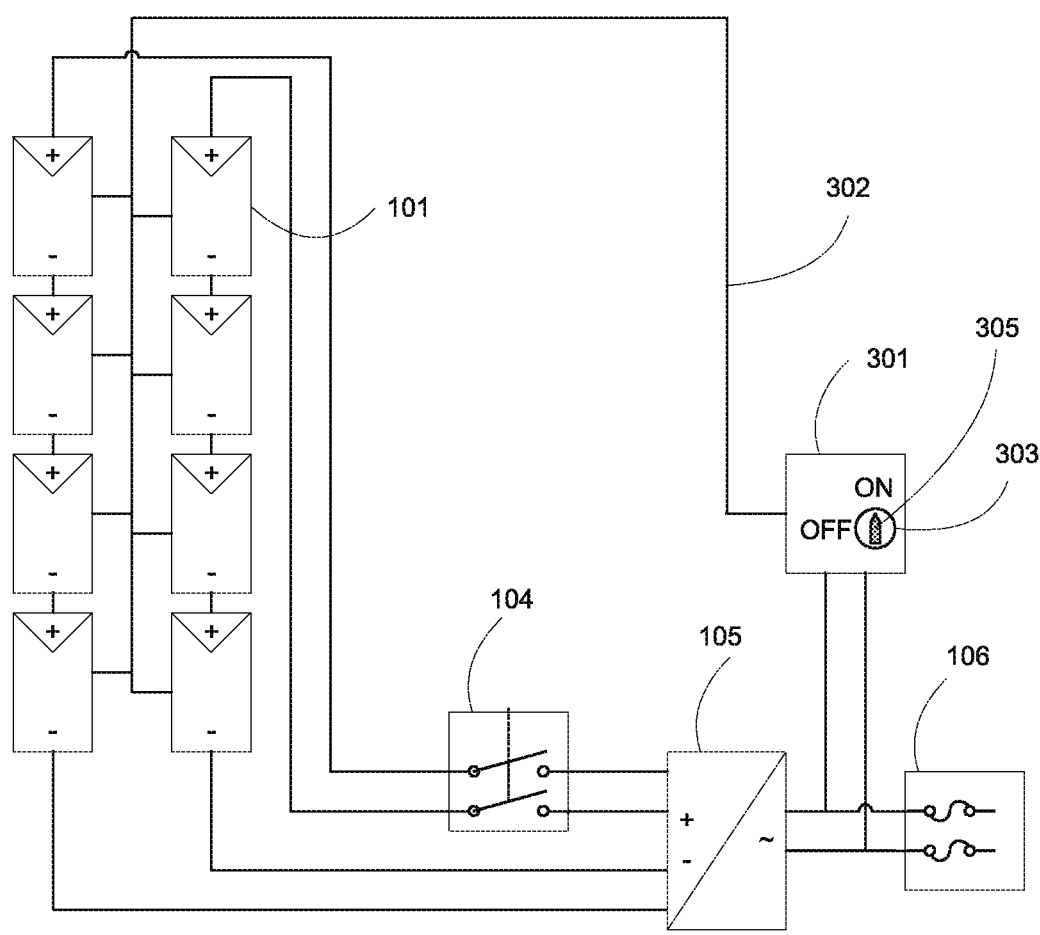
FIG. 3 illustrates an embodiment of a PV system with the additional system-level components.

A system-monitor device 301 creates a "system-on" signal 302, which each individual solar module receives to activate itself and operate normally, as shown in FIG. 3. This signal controls (i.e. enables or disables) each module individually. Disabling a module can be achieved, for example, by shorting out the module or by opening up the string circuit that connects all the modules together. The system-monitor device is connected to the AC power of the system, and when the AC power is off, the "system-on" signal is no longer "true."

Additionally, a manually operated switch 303 that is key operated may also be used to disable the PV system and each individual module therein, in some embodiments. The manual switch may be used by firefighters as well as service technicians to disable all the modules individually. It includes visual feedback 305 to indicate its state.

Figure 4:
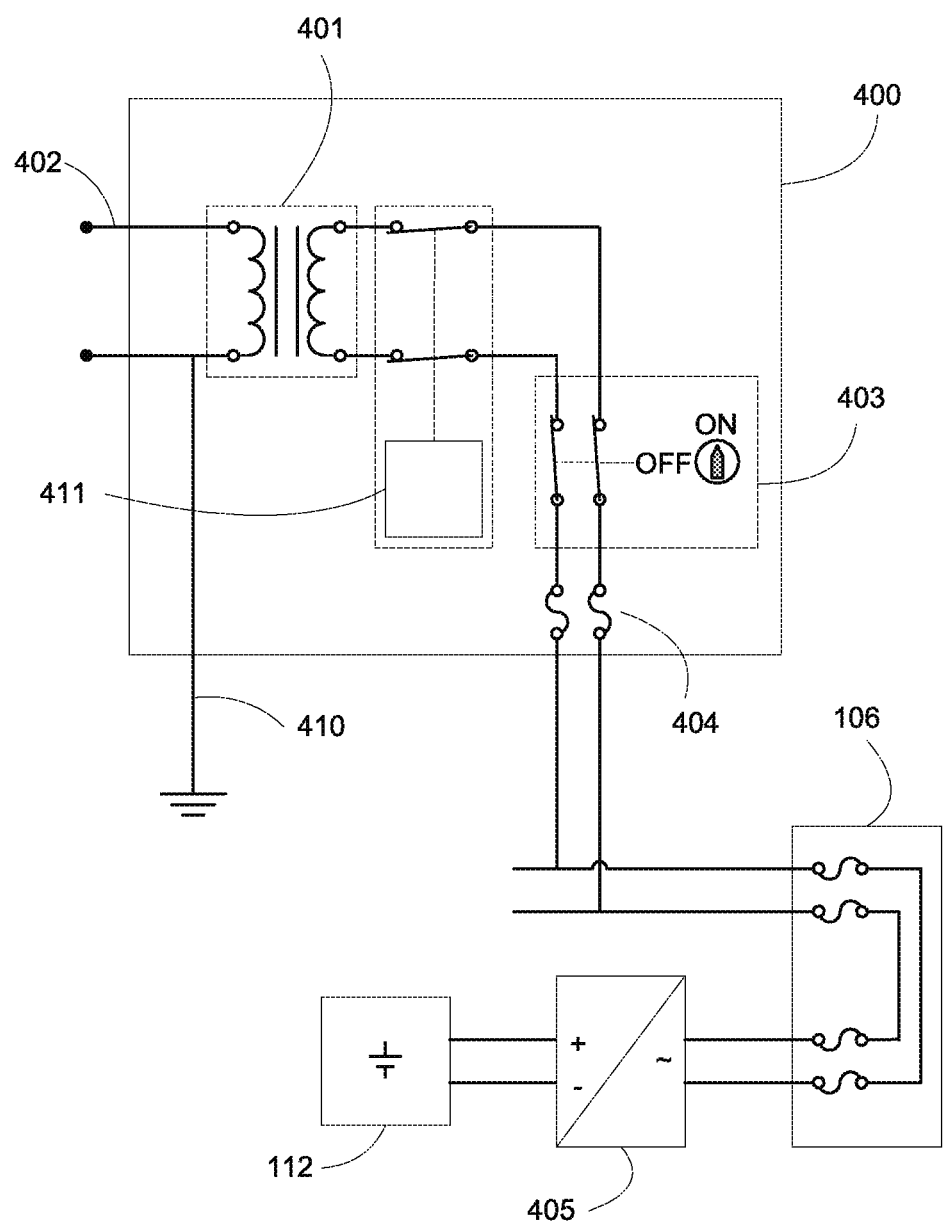
FIG. 4 illustrates the elements within the system-monitor function.

The system-monitor 400, shown in FIG. 4, generates the system-on signal for the modules to begin operation. In one embodiment this particular component is a simple step down transformer 401. Typically, 240 V AC from the AC main panelboard is connected to the primary coil. The transformer generates a low voltage (e.g. –12V AC 60 Hz) signal pair 402 on the secondary coil. An active (e.g. 12V AC) signal indicates to the modules that the AC grid is on, or "system-on" is true. The active signal may be fed via a set of wires that is then routed to each module, for example, by "daisy chaining" the System-On signal to every module. The system-monitor device may have a manual switch 403 with a key-lockout that disconnects the step down transformer from the AC power operated by anyone who needs to disable the PV system.

The system-monitor may employ internal protection fuses 404 for fault conditions. In the case of an off-grid system, the off-grid inverter 405 supplies AC power in order for the system-monitor to operate. Depending on code or safety requirements, one leg of the system-on signal may be bonded to ground with a conductor 410.

For natural or man-made disasters, a motion, water or heat sensor and switch 411 may automatically disable the "system-on," for example, in case of earthquakes, floods, or fires. Those skilled in the art of electronic or electrical design recognize the many options to implement such a sensor switch.

Figure 5:
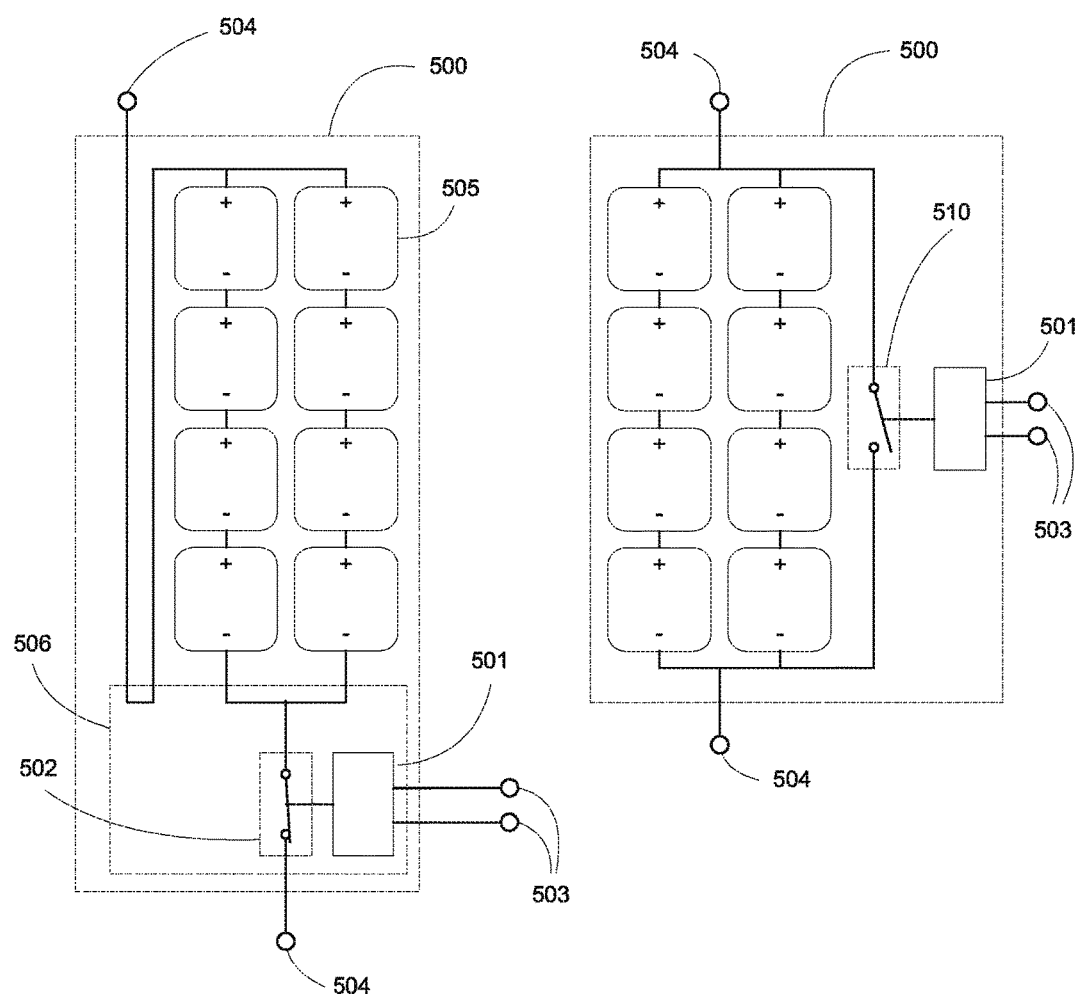
FIG. 5 illustrates the two possible methods to control an individual module.

FIG. 5 illustrates one embodiment of a mechanism to control the module's power production. Solar photovoltaic module junction box 506 may include a logic element 501 and module switch 502 may be part of the module assembly 500 (e.g. inside the module junction box) or be a separate element wired to the module (not shown). The system-on signal may be connected to the logic element with a twin lead connector 503. The module terminals 504 deliver direct current (DC) potential to other modules to form a string. The module switch 502 can be in series with the PV cells 505 and one of the module terminals, in this case the switch 502, disconnects the PV cells from the array. In a second embodiment, the module switch 510 can be in parallel to the PV cells, connecting to both module terminals. The junction box 506 may be a physical box that is secured to or integrated with a photovoltaic module. It may be attached by the module manufacturer at the time of manufacture or thereafter by third parties, in some embodiments.

Each of the module switches is electrically isolated from other module switches since each operates at a different voltage potential. This is due to the series wiring of the modules into a string and the fact that all the module switches share a common signal "system-on". A given module switch in a given array may be operating at a high potential (e.g. 400V) to ground, and the next module in the string at 350V, and so on, assuming each module generated 50 Volts (DC). Electrical isolation between the common System-On signal and the module switch can be achieved a number of ways including but not limited to AC transformer coupling, or optical coupling inside the logic element 501.

The logic element and switch circuitry can be designed in a number of ways. Those skilled in the art of electronic circuit design will understand the proper selection of the individual components, the detail of which is left out for clarity.

The electro-magnetic relay-based system uses electromechanical systems for isolation and switching. The signal system-on has enough power to energize a standard AC relay coil. The signal is operating at a voltage considered safe to humans (low voltage, e.g. 12V AC). To control a module using a relay, the switch may be in series or in parallel with the PV cells.

Figure 6:
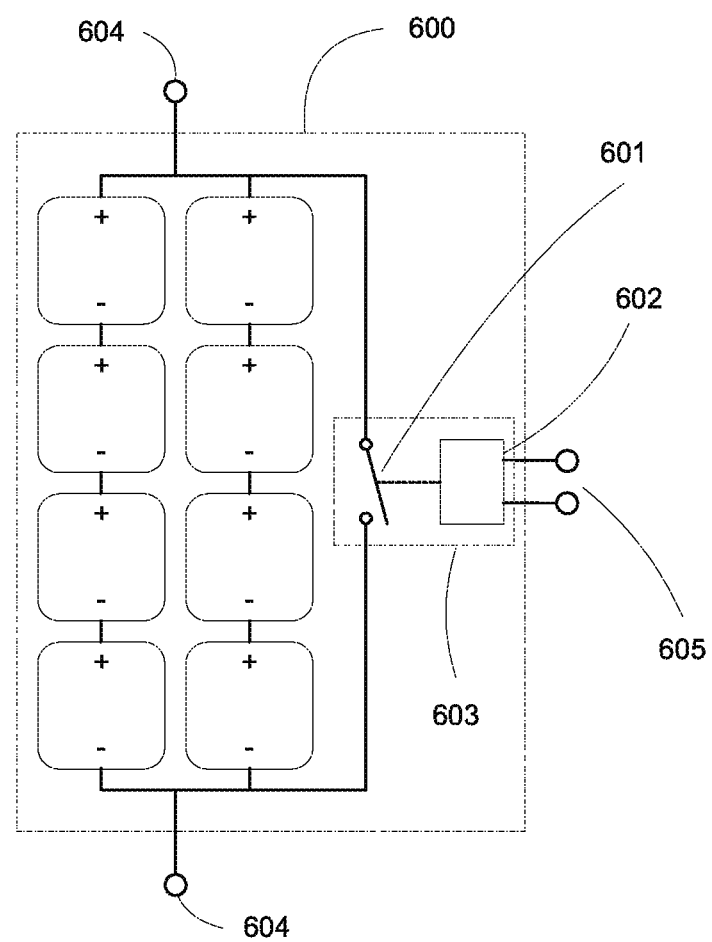
FIG. 6 illustrates a module embodiment utilizing an electromechanical relay as the means to control the module.

FIG. 6 shows the circuit of a module assembly 600 with the module switch in parallel. In a system where the signal system-on is true (e.g. 12V AC) the energized coil 602 moves the normally closed (NC) contact 601 of the relay 603 to open up and allows the cells to produce power at the module terminals. The power from the system-on signal connects to the relay's coil through the two-contact system-on connector 605, and the isolation between the system-on signal and the module switch is provided inherently between the relay coil and the relay's contact.

Figure 7:
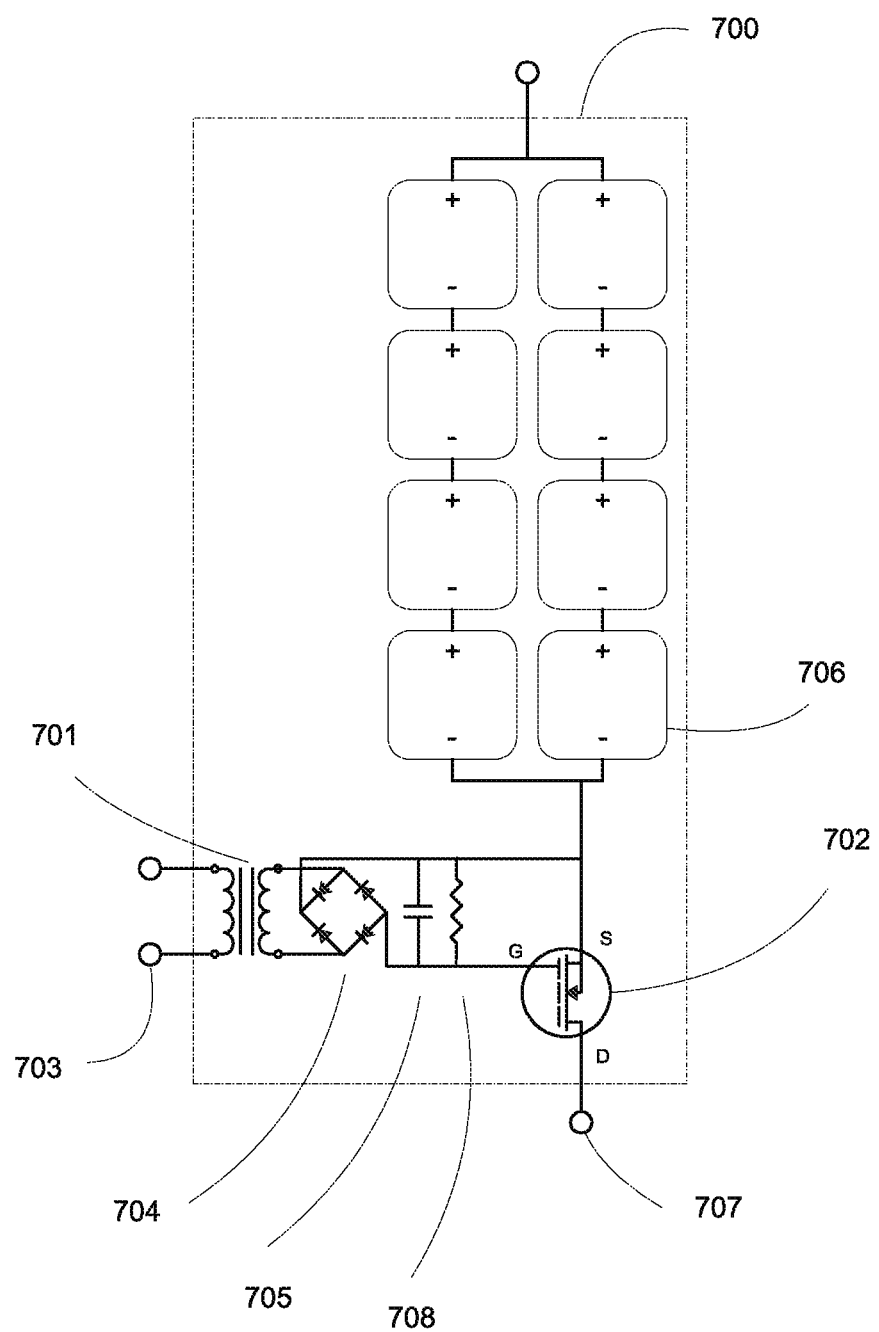
FIG. 7 illustrates a module embodiment utilizing a transformer and transistor as the means to control the module.

FIG. 7 shows the circuit of a module assembly 700 utilizing a small transformer 701 along with a few other components and a transistor 702 to perform the logic element and module switch functions. A basic transformer AC couples the system-on signal, present at the connector 703, through a primary coil to a secondary coil. The primary and secondary coils provide the needed isolation. The coupled and isolated system-on signal is now converted to a DC control signal, for example, through a 4-diode rectifier 704, and the rectified AC ripples are reduced with a capacitor 705. This circuit provides a positive voltage of sufficient level to turn on a power MOSFET transistor 702. The MOSFET source terminal is connected to the negative terminal of the first in a series of cells 706, and the MOSFET drain terminal is connected to the module negative terminal wire 707.

When the system-on signal is false (0V AC), the transistor is off due to the gate voltage (Vgs) being zero, and the module is disconnected from the other modules in the array. With the signal present the transistor will be on and it will close the circuit with the other modules in the string. To ensure the transistor turns off without a system-On signal, a resistor 708 discharges the capacitor.

Figure 8:
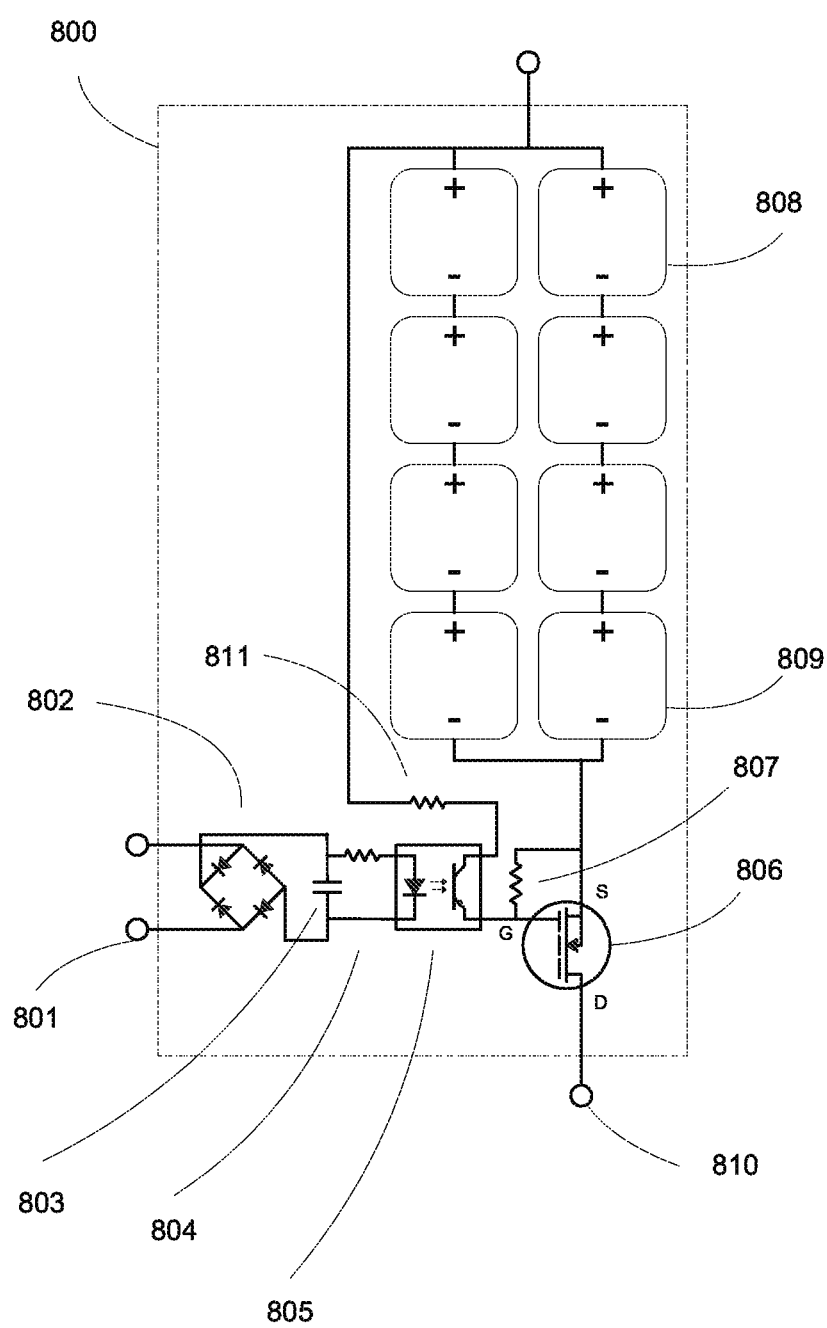
FIG. 8 illustrates a module embodiment utilizing an opto-isolator and transistor as the means to control the module.

The transformer in the previous example can be replaced with an opto-isolator component, as shown in FIG. 8. The system-on signal at the system-on connector 801 is converted to a DC voltage with a diode rectifier 802 and capacitor 803. The DC voltage is current limited through a series resistor 804 to operate the opto-isolator's 805 transmitter (LED). The light energy will activate a photosensitive photo detector (e.g. transistor) in the opto-isolator, the light is providing the electrical isolation. When light is present the opto-isolator's transistor is conducting current, otherwise not. The opto-isolator transistor controls a MOSFET transistor 806, able to handle the module power loads. The N-channel MOSFET is by default off (or open) since the gate is pulled down to the same level as the source with a resistor 807. When the opto-isolator's transistor is on it will raise the voltage of the MOSFET's gate close to the level present at the positive terminal of the last cell in the module 808 if light is present. The MOSFET will be in fully saturated mode and "on," connecting the negative terminal of the first cell 809 to the module's negative terminal 810 allowing the module current to flow through the array. The voltage feeding the gate may need to be limited to protect the MOSFET depending on the choice of components; this can be achieved with an additional resistor 811.

Figure 9:
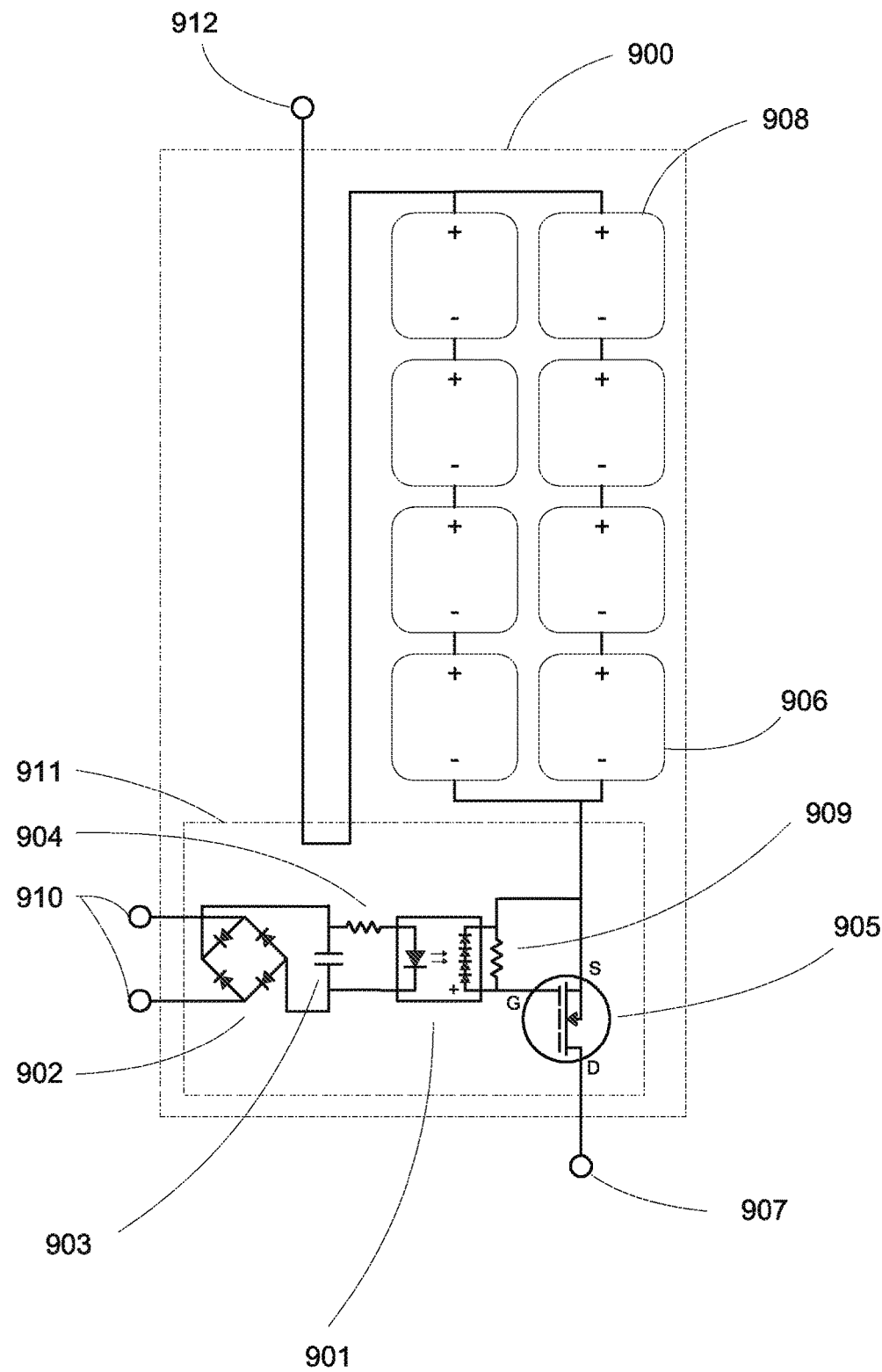
FIGS. 9 and 10 illustrate a module embodiment utilizing an FET driver and transistor as the means to control the module.

In FIG. 9, solar module 900 junction box 911 utilizes a photovoltaic MOSFET (PV FET) driver 901 as the isolation function. The system-on signal is converted to DC through the rectifier 902, capacitor 903, and is current limited through a resistor 904 as it drives the light transmitter (LED) of the PV FET driver. The light energy will be converted by the PV FET driver's photodiodes to a DC voltage of sufficient voltage to directly drive the MOSFET transistor 905 to a fully saturated mode. This in turn will connect the negative terminal of the first cell 906 to the negative module terminal 907. A resistor 909 will guarantee that the transistor will be off by default, by discharging any energy stored from leakage or stray capacitance. The positive module terminal 912 is coupled to cells 908. system-on connector 910 may use twin leads.

Figure 10:
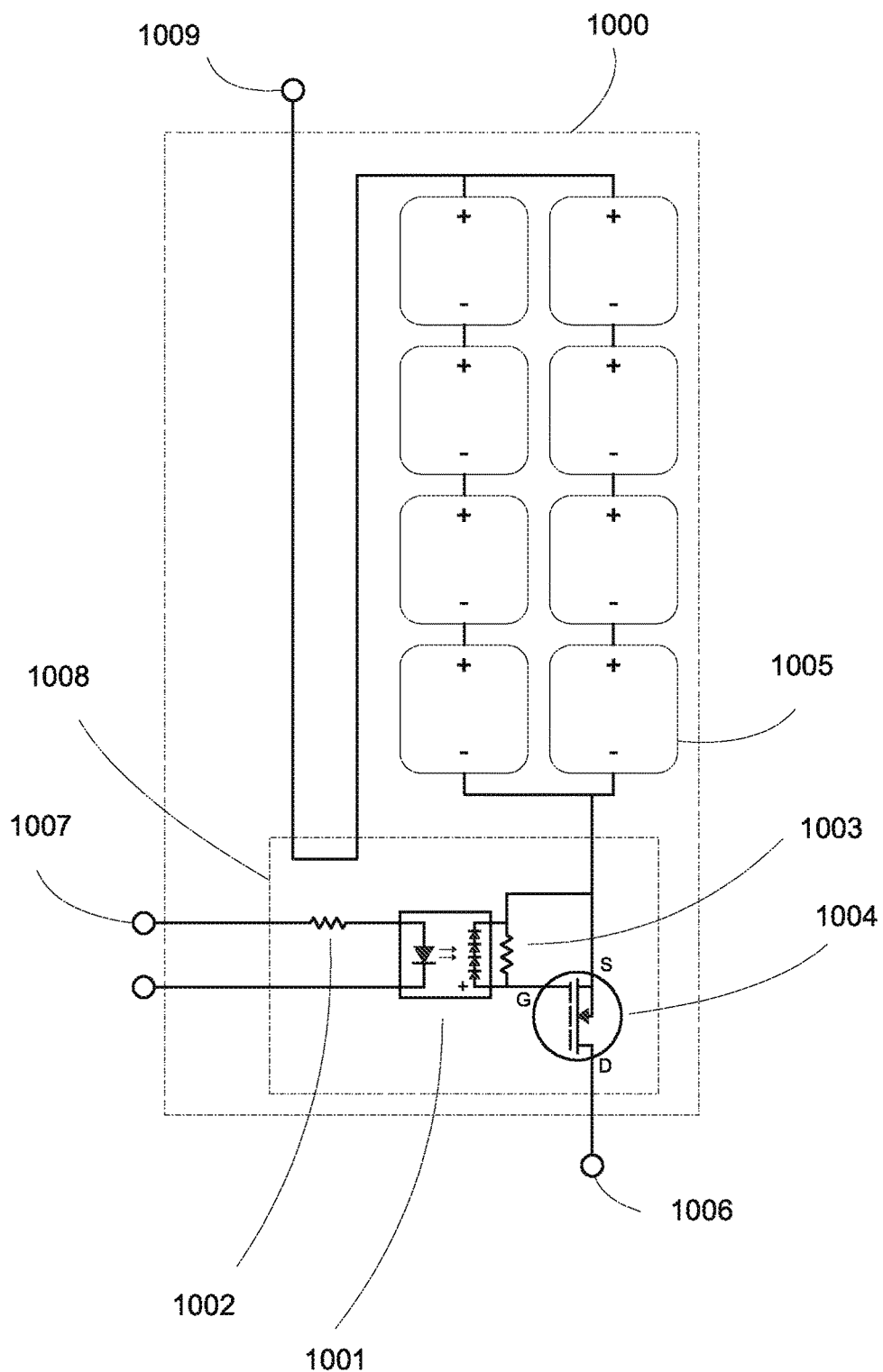

FIG. 10 illustrates another design, which has very few components for reliability and low cost. The system-on signal current (via connector 1007) is limited through resistor 1002 and drives the photo-diode of the FET photovoltaic driver 1001 in the solar module 1000 junction box 1008 to generate light energy for half of the AC cycle. The light energy is converted by the FET-driver to a DC voltage, which is applied to the MOSFET transistor 1004. The inherent gate capacitance of the MOSFET is sufficient to store the needed voltage to turn on the FET for the entire AC cycle, thus eliminating any gate charge storage device. A resistor 1003 turns off the FET to bring it to desired default state of "off" by draining the FET gate charge when the system-on signal is not present. When the system-on signal is present, the transistor is on or fully saturated. This in turn connects the negative terminal of the first cell 1005 to the negative module terminal 1006.

Figure 11:
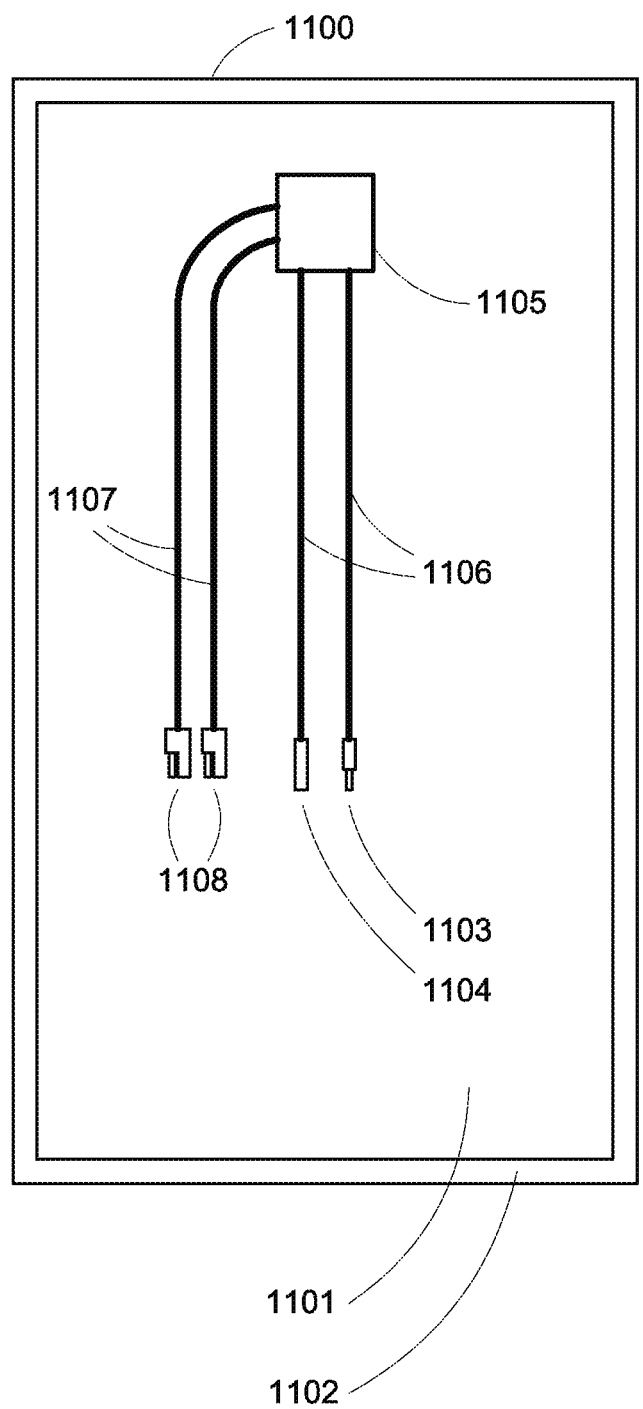
FIG. 11 is a depiction of the back side of one embodiment of a solar module.

Finally, referring to FIG. 11, the back side of a solar module, such as the solar module 1100, is depicted. The back side is the side which is not exposed to receive solar energy. The back side of the module 1100 may include a back sheet 1101. In one embodiment, the junction box 1105 may be integrally formed within the back sheet 1101. In other embodiments, it may be a physical box, such as a plastic electrical box, accessible through the back sheet 1101. A pair of leads 1106 may be provided with a positive terminal 1103 and a negative terminal 1104 to connect a DC potential to the neighboring modules into a string. A second pair of leads 1107 may be provided to "daisy chain" the system-on signal from one module to the next. The connectors 1108 for the system-on signal contain two contacts each.

Another approach is to deliver the signal representing "system-on" as a light signal to the modules. This example requires a modification to the system-monitor device, which will be sending light instead of an AC signal. Each module receives a fiber optic cable and the light received is converted to a voltage as in the case of the MOSFET driver through a series of photo diodes to a voltage level sufficient to turn on the FET.

Those skilled in the art of electronics can appreciate the possible variations of connecting a common signal (system-on) with some form of energy such as an AC or DC voltage, radio waves, or light to an isolated logic element. The logic element in turn drives a module switch that enables power output from the module. The Switch itself may also be integrated into one of the cells in the series (gated cell). Furthermore the circuit that controls the PV module may be part of the module or a separate system component that the module will plug into. The previous examples illustrate a few of the possible ways to implement the principle idea.

In systems with a number of distributed inverters, one for each module, there is no equivalent of the DC disconnect switch, and by turning off the AC mains the PV system will shut down if the micro-inverters are operating as expected. However the ability to shut the PV system down by disabling the power generated from the module itself via the system-monitor device (using the manual lockout switch) provides an additional safety measure and more importantly a consistent and clear visual means to firefighters to ensure that the PV array is indeed off. It also provides a safe and lockable means to people servicing the modules.

Currently a module is "live" the moment it leaves the module factory; there is no "off" switch. Like a charged car battery, PV modules are dangerous to the untrained, and able to generate power. Once an array is wired into a PV system it is a permanent installation and is not ever typically disconnected. The array wires pose a particularly lethal level of power to people since the voltages are typically 200-600V, which by NFPA NEC (National Electric Code) definition is well above "low voltage systems." The only practical means of switching off an array is at the singular DC disconnect point where the lethal voltage levels are present even when switched off. Firefighters are trained to shut off the DC disconnect and the AC mains to a building, however even after both of these actions occur the power generated by the array continues to be present in the array, within the modules, and the wiring on the roof or inside the home leading up to the DC disconnect. If a firefighter were to use an axe to ventilate a roof, cut a wire, cut into a module, or douse a broken array with water—the firefighter would be exposed to high voltages. A path of lethal current to (earth) ground will exist. Additionally if a PV service technician were diagnosing a faulty array for ground faults, or replacing a broken module, this person will be exposed to very high voltages, requiring very careful conduct without any mistakes to remain safe. Electricians prefer in all cases to "lock out and tag out" any circuit they are working on, however a PV array cannot be shut down by any practical means.

By installing a switch in each module it is possible to deactivate each individual module to a level where the voltages will be in the order of 18-50 volts or less. At these levels it is safe to handle the modules or any components of the array.

Each module receives a "system-on" signal, a corresponding logic element, and a switch in or near the module will perform the control of each individual module. These may take the form of simple coils and relays or in other embodiments optical and electronic components. The reliability or cost of these simple components does not pose a cost burden nor a reliability challenge for module manufacturing. Each module has a junction box with a few electronic components in it today (diodes), and this shutdown system can add a few more to the module. In addition to the module switch the PV system may use a system-monitor device. This function may be built into the grid-tie inverter or the off-grid battery charger to lower overall parts and costs.

Figure 12:
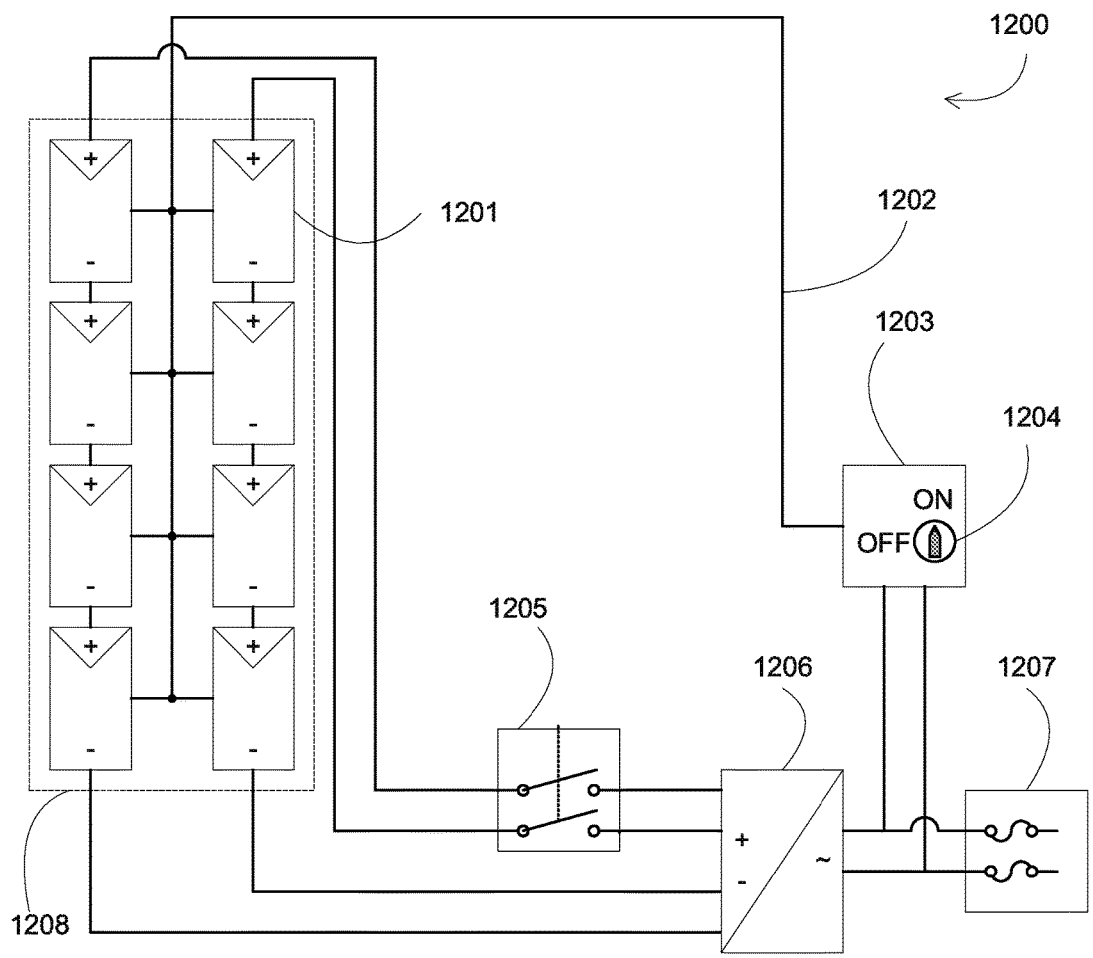
FIG. 12 is a schematic diagram of an implementation of a photovoltaic (PV) system.

Referring now to FIG. 12, a solar photovoltaic (PV) module safety shutdown system 1200 (system) is shown. The system 1200 shown is a grid-tied system, though in other implementations, an off-grid system may be used. PV system 1200 consists of a number of PV modules 1201. Each PV module 1201 individually generates power when exposed to light such as, by non-limiting example, sunlight or another other source of light for which the PV module has been designed to generate electricity. A series of PV modules 1201 is wired together to create a PV array 1208. The PV array 1208 connects to a DC-disconnect switch 1205 and the DC disconnect switch 1205 feeds power to a grid-tied inverter 1206 which converts the DC power from the PV array 1208 to AC power for the grid by connection to an AC main panel 1207, which is tied to the grid (not shown). A system-on signal 1202 is used to allow each individual PV module 1201 to be operational when it is safe to provide power to the PV array 1208. The system-on signal 1202 can be provided by a system-monitor 1203 which in implementations may have a manual switch 1204.

Figure 13:
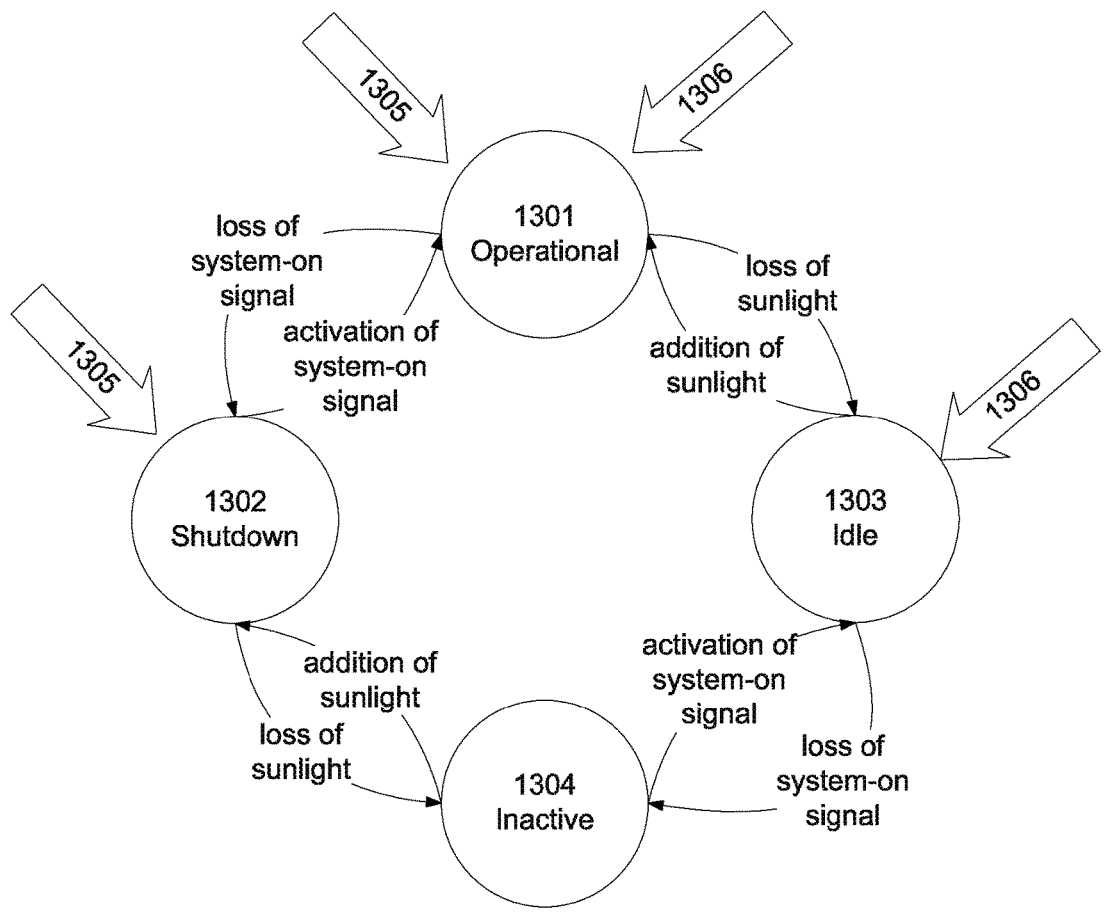
FIG. 13 is an illustration representatively showing various states of the PV system of FIG. 12.

FIG. 13 describes the four states that the PV modules 1201 of the PV system 1200 can normally be in: an operational state 1301; a shutdown state 1302; an idle state 1303; and an inactive state 1304. Some state transitions are shown but, for clarity, not all state transitions are illustrated. The operational state 1301 occurs when the PV modules 1201 are being irradiated with light 1305 and the system-on signal 1306 is active. In the operational state 1301 power is provided from the PV array 1208 to the inverter 1206. The shutdown state 1302 occurs when the PV modules 1201 are being irradiated with light 1305 but the system-on signal 1306 is inactive. In the shutdown state 1302 power is not provided by the PV array 1208 to the inverter 1206. The idle state 1303 occurs when the system-on signal 1306 is active, but the PV modules 1201 are not being irradiated with light 1305 (such as during nighttime hours). In the idle state 1303 power is not provided by the PV array 1208 to the inverter 1206. The inactive state 1304 occurs when there is no system-on signal 1306 and the PV modules 1201 are not being irradiated with light 1305. In the inactive state 1304 power is not provided by the PV array 1208 to the inverter 1206. Accordingly, only in the operational state 1301 are the PV modules 1201 of the PV system 1200 in a condition to present any danger to people or property.

Figure 14:
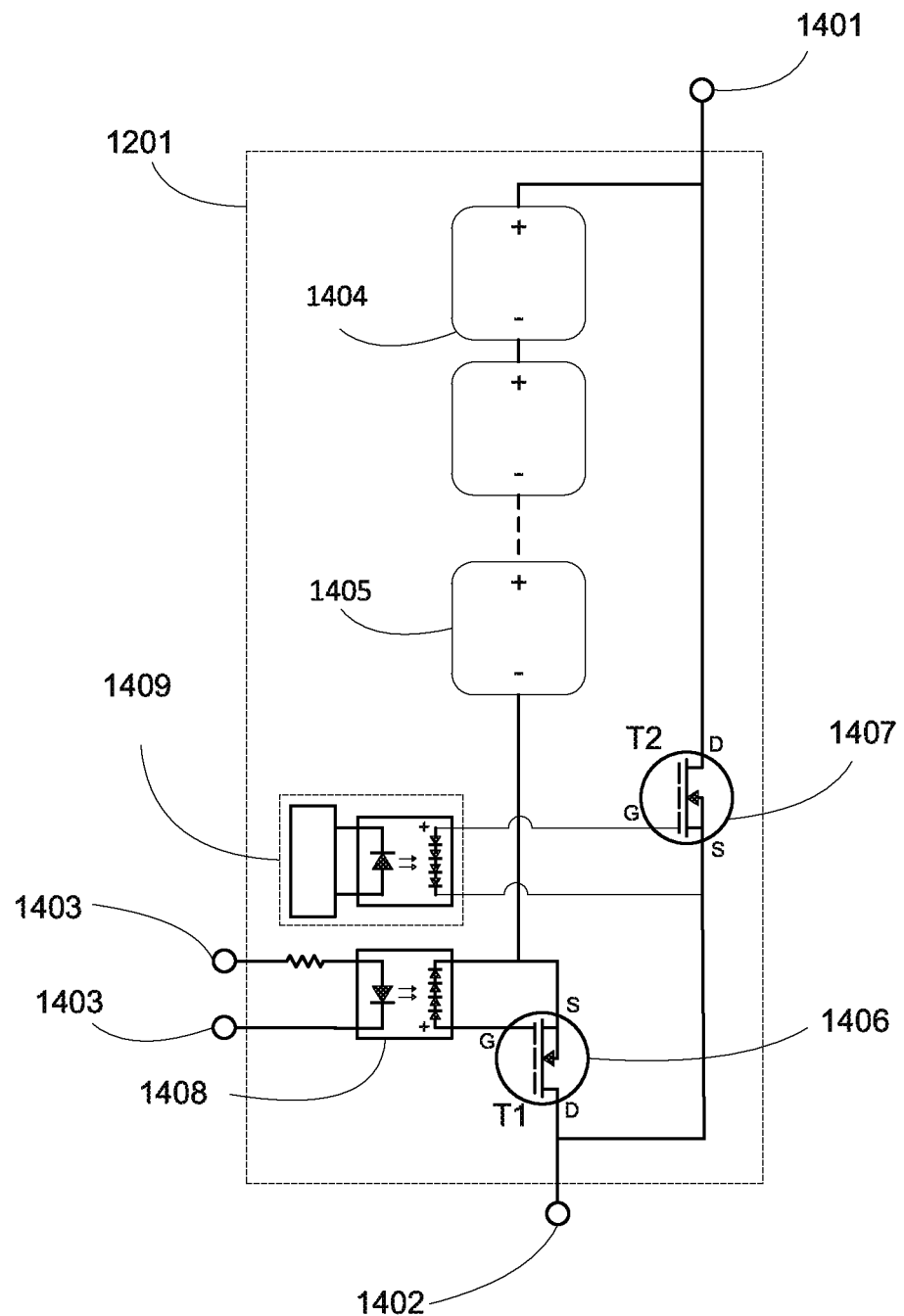
FIG. 14 is a schematic diagram of various elements of the PV system of FIG. 12.

Referring now to FIG. 14, several elements of PV module 1201 are shown. The PV module 1201 includes a series of photovoltaic cells starting with a first cell 1405 and ending with a last cell 1404. The PV module 1201 may include any number of cells, or just one cell, and this is representatively illustrated by the dashed line between the first cell 1405 and the cell directly above it. A module positive connector (MPC) 1401 connects to the last cell 1404 and also connects to a module-off switch 1407 which is configured to selectively force the PV module 1201 into the shutdown state 1302 by providing a low impedance path to the module negative connector (MNC) 1402. The MNC 1402 also connects to the module-on switch 1406 which either connects the first cell 1405 to the MNC 1402 when the PV module 1201 is in the operational state 1301 or idle state 1303, or else isolates the first cell 1405 from the MNC 1402 if the PV module 1201 is in the shutdown state 1302 or inactive state 1304.

In the example shown the module-on switch 1406 is controlled by the FET driver 1408. The FET driver 1408 in various implementations is an opto-isolator and so uses the system-on signal 1202 to generate light internally, which light in turn is used to generate an FET gate driving signal that is electrically isolated from the system-on signal 1202, as has been discussed herein with respect to other implementations of solar photovoltaic module safety shutdown systems. In implementations the FET gate driving signal is a voltage that is applied across the gate and source terminals of the module-on switch 1406. The system-on signal 1202 is supplied to the FET driver 1408 via the system-on connectors 1403 which in various implementations are attached to the PV module 1201. As seen in FIG. 14, the module-on switch 1406, in particular implementations, includes a transistor T1 and the module-off switch 1407 includes a transistor T2. Notations for the gate, source and drain of each transistor are a represented in the figures with the letters G, S and D, respectively.

Figure 15:
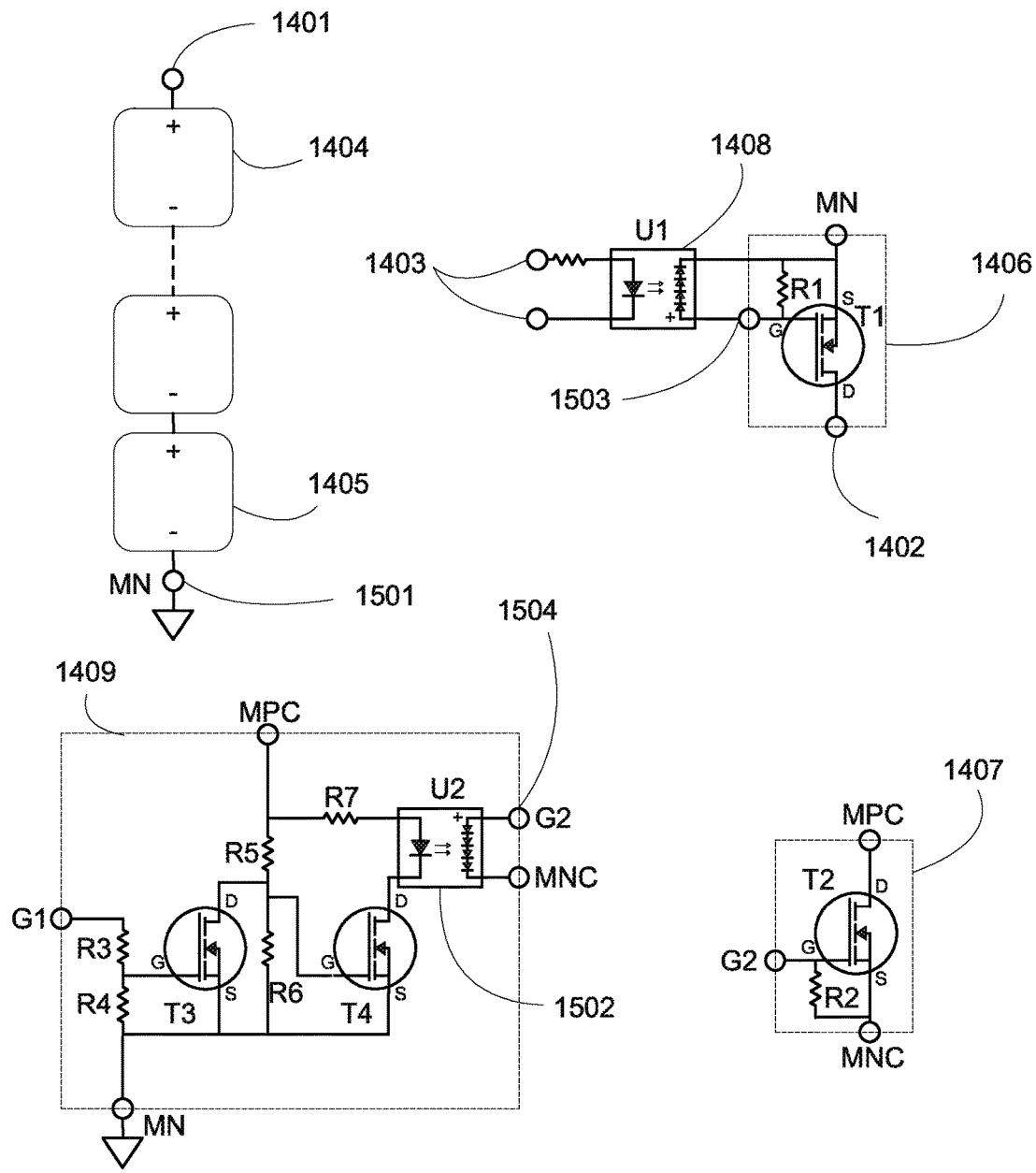
FIG. 15 is another schematic diagram of various elements of the PV system of FIG. 12.
Figure 16:
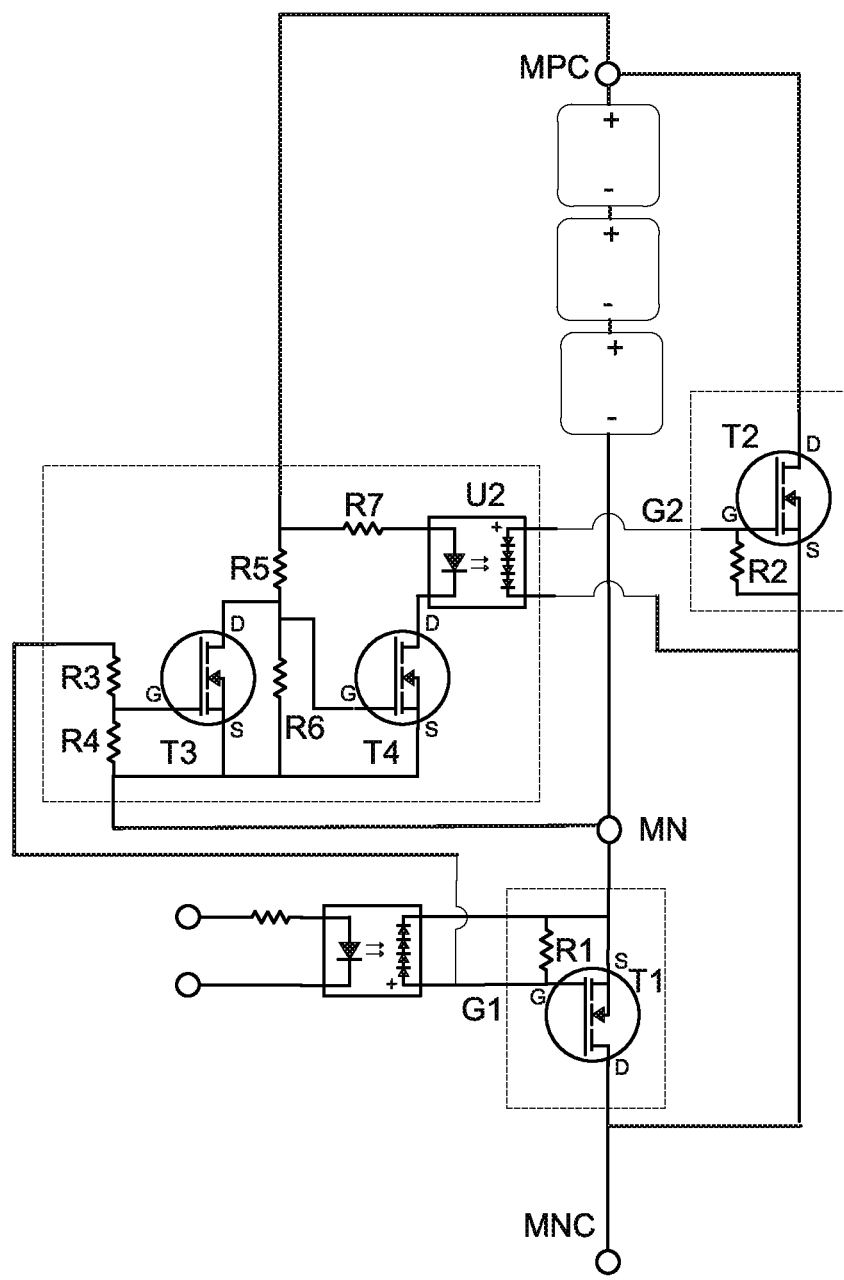
FIG. 16 is another schematic diagram of various elements of the PV system of FIG. 12.

Referring now to FIGS. 15-16, circuit-level diagrams of an implementation of a system 1200 are depicted. Conventional PV module bypass diodes are not shown and do not interact with the functions of the elements described hereafter. Each functional circuit is grouped for clarity, and in FIG. 15 interconnections between the functional circuits are illustrated symbolically using nomenclature described below, while in FIG. 16 the functional circuits are shown coupled together. Many different internal circuit components and connections are possible using the principles disclosed herein, and those illustrated in the drawings are only given as representative examples of ways to achieve the four states 1301-1304 of the PV system 1200.

In the operational state 1301, the gate voltage gate 1503 (G1) of the module-on switch 1406 (T1) will be positive in relation to the module negative node 1501 (MN). The positive G1 signal is provided by the FET driver 1408 (U1). MN is the negative terminal of the first cell 1405. The gate source voltage provided by an active G1 will turn T1 fully on. G1 is also used in the module-off logic 1409 which includes resistors R3, R4, R5, R6, and R7, transistors T3 and T4, and FET driver 1502 (U2). R1 provides a mechanism for the module-on switch 1406 to turn off when G1 is no longer active.

Resistors R3 and R4 divide the G1 signal voltage in order to turn on transistor T3 whenever the system 1200 is in the operational state 1301. If there is light present on the cells the module positive connector (MPC) 1401 will have a voltage present on in the order of about +30V relative to MN for a typical PV module 1201. This voltage is divided between R5 and R6 to control T4. If T3 is on, the voltage across R6 will be close to zero and T4 will then be off, resulting in the operational state 1301.

Alternately if light is present on the PV cells (MPC to MN~30V) and the system-on signal 1202 is not present (G1 to MN=0V), then T4 is on, providing a path to ground (MN) for the current to flow from MPC though the (current limiting) resistor R7 to activate the FET driver U2 (1502). This state is the shutdown state 1302, wherein the module-off switch 1407 is on (low impedance). The FET driver U2 will drive the module-off switch T2 (1407) via the gate voltage of gate 1504 (G2) which is relative to the gate and source of T2 (G2 & MNC). R2 provides a mechanism for the module-off switch 1407 to turn off when G2 is no longer active.

When the system is in the operational state 1301 or idle state 1303 the module-on switch 1406 is on and the module-off switch 1407 is off. In the shutdown state 1302 the module-on switch 1406 is off and the module-off switch 1407 is on. In the inactive state the module-on switch 1406 is off and the module-off switch 1407 is also off.

Though not explicitly labeled in the drawings, at least two separate circuits are formed by the various elements of system 1200. A first circuit includes the PV cells and the module-on switch 1406. This is the main power line through which the power from the PV module 1201 travels through and exits the system 1200. The module-off logic 1409 and module-off switch 1407 are tied into this first circuit as well. A second circuit includes the elements which supply the system-on signal 1202 to turn on the module-on switch 1406, and as indicated in the drawings the first circuit is electrically isolated from the second circuit, such as through the use of an opto-isolator, a transformer, and/or the like, though the first circuit and second circuit are communicatively coupled.

In implementations the module-on switch 1406 and module-off switch 1407 may be integrally formed in or within a back sheet of the PV module 1201. This can be done through various mechanisms now known or hereafter discovered.

Each module-off switch 1407 protects one module-on switch 1406 from over-voltage in the event of wiring errors or faulty system-on signals 1202 of the PV system 1200 and provides a rapid shutdown of the PV array 1208 by individually shorting out one PV module 1201 of the PV array 1208 in the absence of the system-on signal 1202. In implementations the rapid shutdown may entail discharging the PV array 1208 in a timely fashion to a voltage considered safe by the National Electric Code (NEC). Each module-off switch 1407 may be configured to bring its individual PV module 1201 to a non-lethal voltage, and thus the plurality of module-off switches 1407 in a PV array 1208 are configured to cause there to be only non-lethal voltage for any given PV module 1201 when the module-off switches 1407 are turned on.

An overvoltage condition for the module-on switch 1406 can occur if all but one PV module 1201 (or a few but not all) is turned on. The DC array voltage of the PV array 1208 can be in the range of 600-1000V, and a typical low impedance FET used for the module-on switch 1406 will withstand ~60V between the source and drain. In standard operating conditions all the module-on switches 1406 of the PV array 1208 will switch at the same time, opening the PV array 1208 circuit in multiple places at once, and preventing any over voltage conditions for any given module-on switch 1406. Thus each module-on switch 1406 will remain below its maximum operating range.

If only one module-on switch 1406 were to open (turn off) due to a system-on signal 1202 wiring fault, and the rest were to remain on, then the opening switch would experience the full voltage of the PV array 1208. In order to protect from this condition, which may cause permanent damage to the opening switch, the voltage across the module-on switches 1406 is controlled in more than one way.

By adding the module-off switch 1407, which enables in its on state a low impedance path across the module (power) connectors 1401/1402, the voltage is then controlled (limited) for the system-on switches 1406. This has the additional benefit that under normal operating conditions (no wiring errors) and when the system 1200 is shut down, each PV module 1201 will provide a low impedance path to discharge the PV array 1208 wiring and the inverter, thus bringing the entire PV system 1200 to a safe state in rapid fashion.

In implementations the PV module 1201 itself provides the power to run the safety mechanism. In implementations, shorting out a PV module 1201 across all the PV cells provides no voltage (or power) present in the PV module 1201 to power any logic to turn the PV module off. One way to short out one PV module 1201 in the PV array 1208 and at the same time retain the power in each individual PV module 1201 to run the safety logic is to simultaneously open up a connection from a module connector 1401/1402 to the module cells, isolating the PV module 1201 from one of the module connectors 1401/1402 (and other PV modules 1201 and inverter), and at the same time, shorting out the connectors 1401/1402 of the PV module 1201. This provides a safe condition (zero current and voltage) to anything outside the shorted PV module 1201. In this way, the PV module 1201 provides the power to needed to operate the module-off switch to shut itself down.

In implementations a system monitor 301, 400, 1203 may be integrated within, or otherwise formed as a part of, an inverter 105, 113, 1206. In implementations the module-on switch 1406, module-off switch 1407, and module-off logic 1409 will be implemented in a junction box. In other implementations one or more or all of these components may be miniaturized and/or embedded or integrally formed with each other and/or with other elements disclosed herein.

In implementations of a solar photovoltaic module safety shutdown system a DC disconnect may be positioned on a roof near a PV array and a system-on signal may be generated as disclosed herein, with the power supply tied to an AC panel and a manual (on/off) switch at ground level. This may comply with NEC 2014 code and may, in implementations, comply with NEC 2017 code which may call for, by example, less than a 10 foot perimeter around the PV array to be allowed to have live DC voltage after a system shutdown.

In places where the description above refers to particular implementations of solar photovoltaic module safety shutdown systems and related methods and implementing components, sub-components, methods and sub-methods, it should be readily apparent that a number of modifications may be made without departing from the spirit thereof and that these implementations, implementing components, sub-components, methods and sub-methods may be applied to other solar photovoltaic module safety shutdown systems and related methods.

What is claimed is:

1. A solar photovoltaic module safety shutdown system, comprising:
   a module-on switch configured to operatively couple with a first circuit comprising a photovoltaic module and to operatively couple with a System-Monitor device, the System-Monitor device configured to operatively couple to the module-on switch through a second circuit and configured to operatively couple to the photovoltaic module and an alternating current (AC) main panelboard through the first circuit, wherein the first circuit is electrically isolated from the second circuit; and
   a module-off switch coupled with the module-on switch;
   wherein the System-Monitor device is configured to generate a System-On signal and to supply the System-On signal to the module-on switch through the second circuit;
   wherein there are no intermediate components coupled between the System-Monitor device and the module-on switch;
   wherein the module-on switch is configured to disable the photovoltaic module through one of shorting the photovoltaic module and disconnecting the photovoltaic module from the first circuit in response to the System-On signal not being received by the module-on switch from the System-Monitor device; and
   wherein the module-off switch is configured to disable the photovoltaic module through shorting the photovoltaic module in response to the System-On signal not being received by the module-on switch when the photovoltaic module is irradiated with light.

2. The system of claim 1, further comprising module-off logic configured to operatively couple to the photovoltaic module and configured to operatively couple to the module-off switch, the module-off logic configured to drive the module-off switch to an on state in response to a first positive voltage being present between a gate of a transistor of the module-on switch and a negative terminal of a first cell of the photovoltaic module when a second positive voltage is present between a positive terminal of a last cell of the photovoltaic module and the negative terminal of the first cell of the photovoltaic module.

3. The system of claim 1, further comprising module-off logic configured to operatively couple to the photovoltaic module and configured to operatively couple to the module-off switch, the module-off logic configured to drive the module-off switch to an off state in response to no voltage being present between a gate of a transistor of the module-on switch and a negative terminal of a first cell of the photovoltaic module when a positive voltage is present between a positive terminal of a last cell of the photovoltaic module and the negative terminal of the first cell of the photovoltaic module.

4. The system of claim 1, wherein the module-on switch and module-off switch are integrally formed in a back sheet of the photovoltaic module.

5. The system of claim 1, further comprising module-off logic configured to operatively couple to the photovoltaic module and configured to operatively couple to the module-off switch, the module-off logic configured to drive the module-off switch between an on state and an off state, wherein the module-off logic comprises an opto-isolator configured to produce a voltage across terminals of a transistor of the module-off switch in response to a first positive voltage being present between a gate of a transistor of the module-on switch and a negative terminal of a first cell of the photovoltaic module when a second positive voltage is present between a positive terminal of a last cell of the photovoltaic module and the negative terminal of the first cell of the photovoltaic module.

6. The system of claim 1, wherein the module-on switch comprises an opto-isolated field effect transistor (FET) photovoltaic driver configured to provide a gate voltage to a power metal-oxide semiconductor field effect transistor (MOSFET) in response to the System-On signal being received by the module-on switch from the System-Monitor device.

7. The system of claim 6, wherein the module-on switch does not comprise a rectifier, and wherein the opto-isolated FET photovoltaic driver is configured to provide the gate voltage only during half of an AC cycle.

8. The system of claim 7, wherein a gate of the power MOSFET is configured to store a sufficient charge to remain at a high enough voltage to allow the power MOSFET to remain on during an entire AC cycle.

9. The system of claim 1, wherein the System-Monitor device comprises a manual switch and is configured to generate the System-On signal and to supply the System-On signal to the module-on switch only when the manual switch is in an on position.

10. The system of claim 1, wherein the module-on switch comprises an opto-isolator configured to communicatively couple the first circuit with the second circuit while electrically isolating the first circuit from the second circuit.

11. A solar photovoltaic module safety shutdown system, comprising:
a photovoltaic module comprising a module-on switch operatively coupled thereto, the module-on switch and photovoltaic module configured to operatively couple with a first circuit, the module-on switch configured to operatively couple with a System-Monitor device, the System-Monitor device configured to operatively couple to the module-on switch through a second circuit and configured to operatively couple to the photovoltaic module and an alternating current (AC) main panelboard through the first circuit, wherein the first circuit is electrically isolated from the second circuit; and
a module-off switch operatively coupled with the photovoltaic module and the module-on switch;

wherein the System-Monitor device is configured to generate a System-On signal and to supply the System-On signal to the module-on switch through the second circuit;
wherein there are no intermediate components coupled between the System-Monitor device and the module-on switch;
wherein the module-on switch is configured to disable the photovoltaic module in response to the System-On signal not being received by the module-on switch from the System-Monitor device; and
wherein the module-off switch is configured to disable the photovoltaic module through shorting the photovoltaic module in response to the System-on signal not being received by the module-on switch when the photovoltaic module is irradiated with light.

12. The system of claim 11, further comprising module-off logic configured to drive the module-off switch to an on state in response to a first positive voltage being present between a gate of a transistor of the module-on switch and a negative terminal of a first cell of the photovoltaic module when a second positive voltage is present between a positive terminal of a last cell of the photovoltaic module and the negative terminal of the first cell of the photovoltaic module.

13. The system of claim 11, further comprising module-off logic configured to drive the module-off switch to an off state in response to no voltage being present between a gate of a transistor of the module-on switch and a negative terminal of a first cell of the photovoltaic module when a positive voltage is present between a positive terminal of a last cell of the photovoltaic module and the negative terminal of the first cell of the photovoltaic module.

14. The system of claim 11, wherein the module-on switch and module-off switch are integrally formed within a back sheet of the photovoltaic module.

15. The system of claim 11, further comprising module-off logic configured to drive the module-off switch between an on state and an off state, wherein the module-off logic comprises an opto-isolator configured to produce a voltage across terminals of a transistor of the module-off switch in response to a first positive voltage being present between a gate of a transistor of the module-on switch and a negative terminal of a first cell of the photovoltaic module when a second positive voltage is present between a positive terminal of a last cell of the photovoltaic module and the negative terminal of the first cell of the photovoltaic module.

16. A solar photovoltaic module safety shutdown system, comprising:
a first photovoltaic module comprising a first module-on switch and a first module-off switch, the first photovoltaic module operatively coupled with a first circuit, the first circuit operatively coupled to an alternating current (AC) main panelboard;
a second photovoltaic module comprising a second module-on switch and a second module-off switch, the second photovoltaic module operatively coupled with the first photovoltaic module through the first circuit;
a second circuit operatively coupled with the first module-on switch and with the second module-on switch, wherein the second circuit is electrically isolated from the first circuit; and
a System-Monitor device operatively coupled with the first circuit, the second circuit, and the AC main panelboard, the System-Monitor device comprising a manual switch, the System-Monitor device configured to generate a System-On signal and to supply the System-On signal to the first module-on switch and to the second module-on switch through the second circuit when the manual switch is in an on state;

wherein there are no intermediate components coupled between the System-Monitor device and the module-on switch;

wherein the first module-on switch is configured to disable the first photovoltaic module when the System-On signal is not received by the first module-on switch from the second circuit;

wherein the first module-off switch is configured to disable the first photovoltaic module through shorting the first photovoltaic module in response to the System-On signal not being received by the first module-on switch when the first photovoltaic module is irradiated with light;

wherein the second module-on switch is configured to disable the second photovoltaic module when the System-On signal is not received by the second module-on switch from the second circuit; and wherein the second module-off switch is configured to disable the second photovoltaic module through shorting the second photovoltaic module in response to the System-On signal not being received by the second module-on switch when the second photovoltaic module is irradiated with light.

17. The system of claim 16, wherein the first photovoltaic module comprises module-off logic configured to drive the first module-off switch to an on state in response to a first positive voltage being present between a gate of a transistor of the first module-on switch and a negative terminal of a first cell of the first photovoltaic module when a second positive voltage is present between a positive terminal of a last cell of the first photovoltaic module and the negative terminal of the first cell of the first photovoltaic module.

18. The system of claim 16, wherein the first module-on switch and first module-off switch are integrally formed in a back sheet of the first photovoltaic module and wherein the second module-on switch and second module-off switch are integrally formed in a back sheet of the second photovoltaic module.

19. The system of claim 16, wherein the first photovoltaic module comprises module-off logic configured to drive the first module-off switch to an off state in response to no voltage being present between a gate of a transistor of the first module-on switch and a negative terminal of a first cell of the first photovoltaic module when a positive voltage is present between a positive terminal of a last cell of the first photovoltaic module and the negative terminal of the first cell of the first photovoltaic module.

20. The system of claim 16, wherein the first photovoltaic module comprises module-off logic configured to drive the first module-off switch between an on state and an off state, wherein the module-off logic comprises an opto-isolator configured to produce a voltage across terminals of a transistor of the first module-off switch in response to a first positive voltage being present between a gate of a transistor of the first module-on switch and a negative terminal of a first cell of the first photovoltaic module when a second positive voltage is present between a positive terminal of a last cell of the first photovoltaic module and the negative terminal of the first cell of the first photovoltaic module.

* * * * *